United States Patent [19]
Cruz et al.

[11] Patent Number: 6,016,082
[45] Date of Patent: Jan. 18, 2000

[54] LOW PHASE NOISE LC OSCILLATOR FOR MICROPROCESSOR CLOCK DISTRIBUTION

[75] Inventors: Jose M. Cruz, Palo Alto; Robert J. Bosnyak, San Jose; Robert J. Drost, Palo Alto, all of Calif.

[73] Assignee: Sun Microsystems, Inc., Palo Alto, Calif.

[21] Appl. No.: 09/023,360

[22] Filed: Feb. 13, 1998

[51] Int. Cl.[7] .............................. H03B 5/12; H03B 5/18; H03L 7/099

[52] U.S. Cl. .......................... 331/117 FE; 331/8; 331/17; 331/36 C; 331/74; 331/75; 331/96; 331/117 D; 331/177 V

[58] Field of Search ................................. 331/8, 15–18, 331/25, 36 C, 60, 70, 74, 75, 96, 100, 117 R, 117 FE, 117 D, 108 C, 177 V

[56] References Cited

U.S. PATENT DOCUMENTS

| | | | |
|---|---|---|---|
| 4,918,406 | 4/1990 | Baumbach et al. | 331/117 R |
| 5,159,293 | 10/1992 | Pulice | 331/177 V |
| 5,175,512 | 12/1992 | Self | 331/57 |
| 5,294,894 | 3/1994 | Gebara | 331/1 A |
| 5,434,543 | 7/1995 | Brilka et al. | 331/117 R |
| 5,467,060 | 11/1995 | Miyashita | 331/74 |
| 5,561,398 | 10/1996 | Rasmussen | 331/36 C |

OTHER PUBLICATIONS

Nhat M. Nguyen, & Robert G. Meyer, "Si IC–Compatible Inductors and LC Passive Filters, "*IIEE Journal of Solid State Circuits*, vol. 25,, No. 4, pp. 1028 to 1031, Aug. 1990.

R. Bhagwan & A. Rogers, "A 1GHZ Dual–Loop Microprocessor PLL with Instant Frequency Shifting, "*1997 IEEE International Solid–State Circuits Conference*, pp. 336, 337, Feb. 8, 1997.

J. Craninckx & M. Steyaert, "A 1.8–GHz Low–Phase–Noise CMOS VCO Using Optimized Hollow Spiral Inductors, "*IEEE Journal of Solid State Circuits*, vol. 32, No. 5, pp. 736 to 744, May 1997.

*Primary Examiner*—David Mis
*Attorney, Agent, or Firm*—Forrest Gunnison

[57] ABSTRACT

A microprocessor includes an on-chip low phase noise CMOS LC capacitance oscillator. The LC oscillator is relatively insensitive to power supply fluctuations. In addition, the LC oscillator is operable over a range of frequencies sufficient to support both normal full power operation, and reduced power operation of the microprocessor. The LC oscillator minimizes clock jitter problems and so permits extension of the microprocessor operating frequency to even higher levels than heretofore were possible. An output signal from a phase-frequency detector is a frequency control signal on a frequency control input line of a level converter and filter circuit of the LC oscillator. The output signal from level converter and filter circuit is a filtered frequency control signal on a control voltage input line to a continuously modifiable gigahertz frequency voltage controlled oscillator (VCO) circuit. Continuously modifiable gigahertz frequency VCO circuit generates an output signal with a frequency that is dependent on the voltage on control voltage input line. The output signal from the continuously modifiable gigahertz frequency VCO is a differential current signal to a level shifter output circuit. The level shifter output circuit converts the current signal to a single-ended voltage that is supplied to an output driver. The output driver provides the output signal to a clock distribution network.

29 Claims, 6 Drawing Sheets

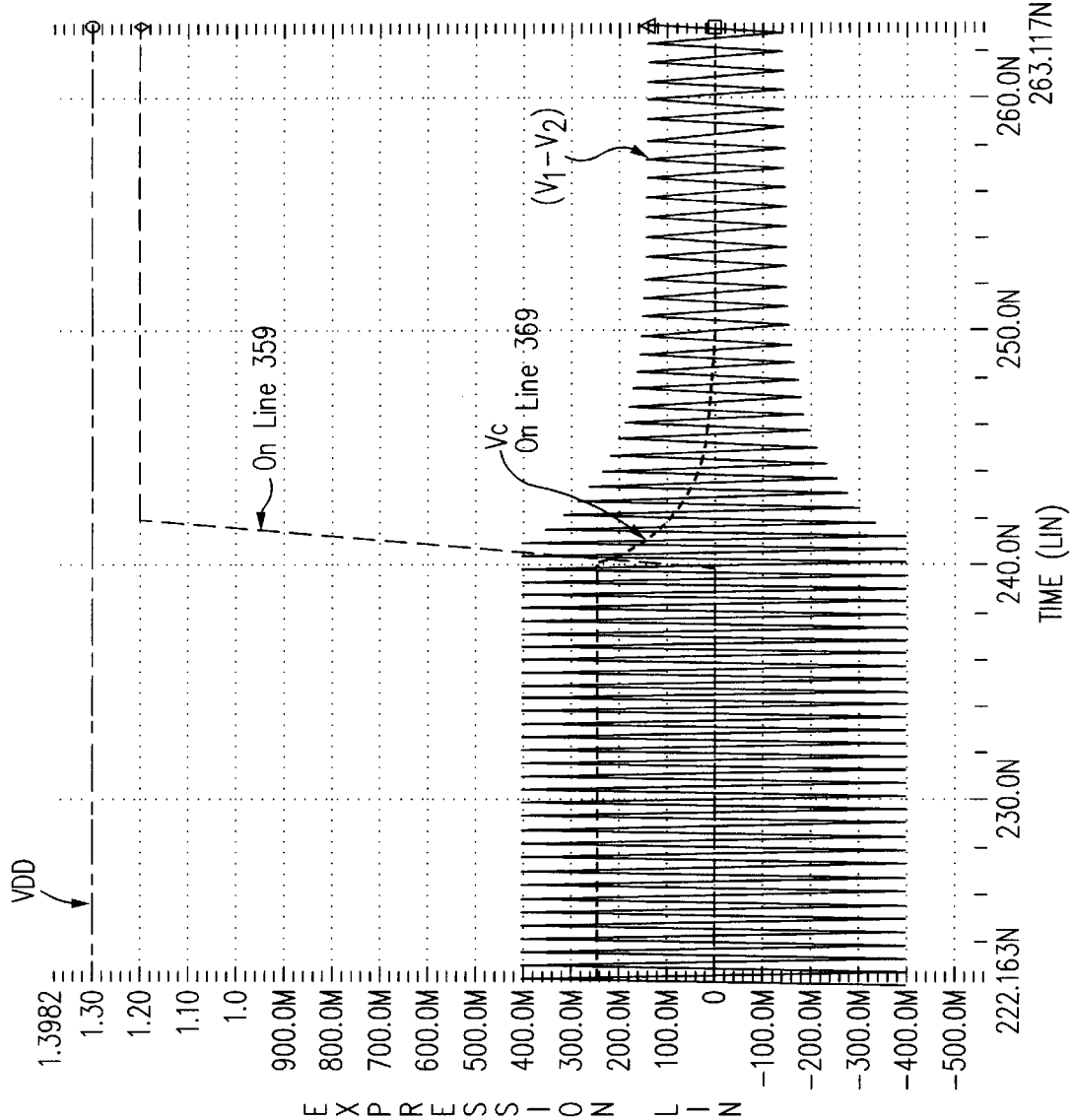

LOW PHASE NOISE LC OSCILLATOR FOR MICROPROCESSOR CLOCK DISTRIBUTION

BACKGROUND OF THE INVENTION

1. Field of the Invention

This invention relates generally to oscillator circuits, and more particularly to on-chip microprocessor oscillator circuits used in clock distribution.

2. Description of Related Art

Planar inductors and inductance capacitance (LC) filters have been implemented in semiconductors using a variety of substrates. N. M. Nguyen and R. G. Meyer, in "Si IC-Compatible Inductors and LC Passive Filters," *IEEE Journal of Solid-State Circuits*, Vol. 25, No. 4, pp. 1028 to 1031 (1990), which is incorporated herein by reference, describe inductors and LC filters fabricated in a production silicon bipolar integrated circuit processing. Nguyen and Meyer describe how to implement a spiral planar inductor that can be used for high-frequency on-chip filtering, inductive peaking of high frequency amplifiers, and impedance matching for low-noise amplifiers.

J. Craninckx and M. Steyaert, in "A 1.8 GHz Low-Phase-Noise CMOS VCO Using Optimized Hollow Spiral Inductors," *IEEE Journal of Solid-State Circuits*, Vol. 32, No. 5, pp 736–744 (1997), which is incorporated herein by reference, explain how to extend the use of a spiral inductor to complementary metal-oxide silicon(CMOS) circuitry. FIG. 1 is a block diagram of a phase-locked-loop(PLL) based frequency synthesizer 100 as presented by J. Craninckx and Steyaert for radio-frequency telecommunications.

A voltage controlled oscillator (VCO) 103 generates an output signal having a frequency fOUT. The output signal is fedback to prescaler 104 which in turn divides signal frequency fOUT by a predefined amount. The resulting signal with frequency fDIV is one input signal to phase detector 101. The other inputs signal to phase detector 101 is a signal with a reference frequency fREF.

In response to the two input signals, phase detector 101 generates a phase correction signal that is filtered by loop filter 102 and applied to variable controlled oscillator 103 as a control signal. Here, VCO 103 is used as the local oscillator to mix down signals present in a narrow gigahertz frequency channel while rejecting signals in the adjacent frequency channels.

VCO 103 was implemented using oscillator circuit 200. Oscillator circuit 200 has a bias circuit that includes a current source 205 that is coupled to a current mirror formed by P-channel MOSFETs (Metal-Oxide-Silicon Field Effect Transistors) 201 and 202. The output of the bias circuit is connected to a first lead of spiral inductor 213 and a first lead of spiral inductor 214. A second lead of spiral inductor 213 is connected to a drain of N-channel MOSFET 203 while a second lead of spiral inductor 214 is connected to a drain of N-channel MOSFET 204. The sources of MOSFETs 203 and 204 are connected to ground.

A gate of MOSFET 203 is connected to the drain of MOSFET 204 that is also connected to line VOUT−. A gate of MOSFET 204 is connected to the drain of MOSFET 203 that is also connected to line VOUT+.

Junction varactor 223 is connected between a control voltage line VC from loop filter 102 and the drain of MOSFET 203. Junction varactor 224 is connected between control voltage line VC and the drain of MOSFET 204.

Thus, the two spiral inductors are connected in series, and MOSFETs 203 and 204 are coupled in positive feedback to provide a negative resistance. Junction varactors 223 and 224 function as voltage-controlled capacitors.

The free running oscillation frequency of circuit 200 is determined by the LC tank of circuit 200. The capacitance of the LC tank was reported to be formed by the parasitic capacitance of spiral inductors 213 and 214 to the substrate, the drain-bulk, gate-drain and gate-source capacitances of MOSFETs 203 and 204, and the capacitance of varactors 223, and 224. The sizes of MOSFETs 203 and 204 were a channel length of 0.7 $\mu$m and a channel width of 400 $\mu$m.

Each varactor was a one picofarad(pf) tunable capacitor. This configuration resulted in about a 1 GHz oscillator with a tuning range as large as 14%. Unfortunately, this range is not sufficient for use in applications such as microprocessors because typically, a microprocessors must operate over a range of frequencies that differ by more than 14%. For example, a power saving mode of a microprocessor can require more than a 14% change in the oscillation frequency.

To meet the range of frequency requirements of a microprocessor, oscillator circuits used in CMOS microprocessors are different from that shown in FIGS. 1 and 2. An example of one microprocessor phase locked loop application is presented in R. Bhagwan and A. Rogers, "A 1 GHz Dual-Loop Microprocessor PLL with Instant Frequency Shifting," 1997 *IEEE International Solid-State Circuits Conference*, pp. 336, 337 (1997), which is incorporated herein by reference.

The PLL circuit described by Bhagwan and Rogers is used to multiply the frequency of an external clock reference to synthesize a higher-frequency clock signal for the clock distribution networks of the microprocessor. The PLL circuit utilizes a ring oscillator that is made up of a set of gain elements, that each have a signal transition delay, connected in a ring structure. The set of gain elements are typically differential or single-ended transistor inverter stages. A ring oscillator is a typical implementation for microprocessor PLL circuits in general.

Ring oscillators are able to operate over a broad range of frequencies. However, a ring oscillator is sensitive to variations in the power supply voltage. Variations in the power supply voltage contribute to the generation of a significant amount of jitter in the output signal. Since the power supply voltage of a microprocessor is typically very noisy, output jitter is a significant limitation of a ring oscillator.

The problem of output jitter becomes even more pronounced as the operating frequencies of the microprocessors increase, because the clock cycles become shorter. Typically, attempts are made to reduce the output jitter from the ring oscillator by regulating the control signal applied to the oscillator. Unfortunately, the circuitry used to regulate the control circuit becomes more difficult to implement as the power supply voltage levels drop. Consequently, a PLL circuit is needed that has minimal jitter, is insensitive to power supply noise, operates for a variety of power supply levels, and has a wide frequency range.

SUMMARY OF THE INVENTION

According to the principles of this invention, a microprocessor includes an on-chip low phase noise CMOS (complementary metal-oxide-silicon) LC(inductance capacitance)oscillator. This LC oscillator overcomes the limitations of the prior art microprocessor oscillators by being relatively insensitive to power supply fluctuations. In addition, the LC oscillator is operable over a range of frequencies sufficient to support both normal full power operation, and reduced power operation of the microprocessor. The LC oscillator minimizes clock jitter problems and so permits extension of the microprocessor operating frequency to even higher levels than heretofore were possible.

In one embodiment, the LC oscillator circuit of this invention includes a level shifter and filter circuit, a continuously modifiable gigahertz frequency voltage controlled oscillator, and a level shifter output circuit. The level shifter and filter circuit receives a frequency control signal on a frequency control input line and in response to the frequency control signal generates a control voltage, indicative of the frequency control signal, on a control voltage output line. Since the frequency control input signal is continuously variable, the control voltage varies in response to changes in the frequency control input signal.

The continuously modifiable gigahertz frequency voltage controlled oscillator is connected to the control voltage output line and so receives the control voltage as an input signal. In response to the control voltage, the continuously modifiable gigahertz frequency voltage controlled oscillator generates oscillating output signals on a plurality of output lines. The oscillation frequency of the oscillating signals is determined by the level of the control voltage signal. Since the control voltage signal is continuously variable, the oscillation frequency is also continuously variable.

A level shifter output circuit is connected to the plurality of output lines of the continuously modifiable gigahertz frequency voltage controlled oscillator. The level shifter output circuit converts a differential input signal to a signal-ended output signal and thereby generates an oscillating signal on an oscillator output line in response to signals on the plurality of output lines of the continuously modifiable gigahertz frequency voltage controlled oscillator.

The signal on the oscillator output line is provided to a clock distribution network in the microprocessor. One of the lines in the clock distribution network is routed to a phase-frequency detector which in turn generates the frequency control signal.

The LC oscillator of this invention has several advantages over prior art microprocessor oscillator circuits. Operation of the LC oscillator circuit is unaffected by the noise and fluctuations that are found in the power supply voltage of a high-speed microprocessor. Unlike the limited frequency range of the LC oscillators used in the telecommunication industry, the continuously variable frequency range of the LC oscillator circuit permits use of the circuit over the complete range of frequencies typically encountered in the operation of a microprocessor, e.g., the various frequencies used in different power-on states of the microprocessor. Also, the LC oscillator only requires a supply voltage that is greater than the threshold voltage of a CMOS transistor and so the LC oscillator can be used in low voltage microprocessor applications.

In one embodiment, the continuously modifiable gigahertz frequency voltage controlled oscillator includes a bias circuit and a core oscillator circuit. The core oscillator circuit includes a CMOS spiral inductor connected between the first and second bias circuit output lines. A first voltage controlled CMOS capacitor in the core oscillator circuit has a first lead connected to the first bias circuit output line and another lead connected to the control voltage line. A second voltage controlled CMOS capacitor in the core oscillator circuit has a first lead connected to the second bias circuit output line and a second lead connected to the control voltage line.

The core oscillator circuit also includes a first MOSFET having a first lead connected to the first bias circuit output line, a second lead connected to a first reference voltage, and a gate connected to the second bias circuit output line. A second MOSFET has a first lead connected to the second bias circuit output line, a second lead connected to the first reference voltage, and a gate connected to the first bias circuit output line.

In one embodiment the first voltage controlled capacitor is a third MOSFET having a gate connected to the first lead of the first voltage controlled capacitor, a first lead connected to a second reference voltage, and a second lead connected to the control voltage line. Similarly the second voltage controlled CMOS capacitor is a fourth MOSFET having a gate connected to the first lead of the second voltage controlled CMOS capacitor, a first lead connected to the second reference voltage, and a second lead connected to the control voltage line.

The core oscillator circuit also includes an output sense circuit having a first sense circuit input line connected to the second bias circuit output line and a second sense circuit input line connected to the first bias circuit output line. A first sense circuit output line and a second sense circuit output line are the plurality of output lines of the continuously modifiable gigahertz frequency voltage controlled oscillator.

The bias circuit in the continuously modifiable gigahertz frequency voltage controlled oscillator includes a current mirror having an input branch and two output branches. The first bias circuit output line is connected to one of the two output branches, and the second bias circuit output line is connected to another of the two output branches. A current source is connected to the input branch of the current mirror.

The input branch of the current mirror includes a first MOSFET having a first channel of a first size, and one of the two output branches has a second MOSFET having a second channel of a second size. The second size is greater than the first size.

In one embodiment, a level shifter and filter circuit is simply a filter circuit having a control voltage output line connected to a second lead of the first voltage controlled capacitor, and to a second lead of the second voltage controlled capacitor. In another embodiment, the level shift and filter circuit includes a low pass filter, and converts an input voltage to a current signal.

BRIEF DESCRIPTION OF THE DRAWINGS

FIGS. 6A and 6B are a cross-sectional view of the voltage controlled capacitors of this invention.

FIG. 7 is the output of a computer simulation of the operation oWthe LC oscillator of this invention.

In the following description, elements with the same reference number are the same element. In addition, the first digit of a reference number for an element is the number of the Figure in which the element first appears.

DETAILED DESCRIPTION OF THE INVENTION

According to the principles of this invention, a microprocessor 350 includes an on-chip low phase noise CMOS (complementary metal-oxide-silicon) LC(inductance capacitance)oscillator 300(FIG. 3), sometimes called LC oscillator 300. As explained more completely below, LC oscillator 300 overcomes the limitations of the prior art microprocessor oscillators by being relatively insensitive to power supply fluctuations. In addition, LC oscillator 300 is operable over a range of frequencies sufficient to support both normal full power operation, and reduced power operation of the microprocessor. Therefore, LC oscillator 300 minimizes clock jitter problems and so permits extension of the microprocessor operating frequency to even higher levels than heretofore were possible.

Figure 1:
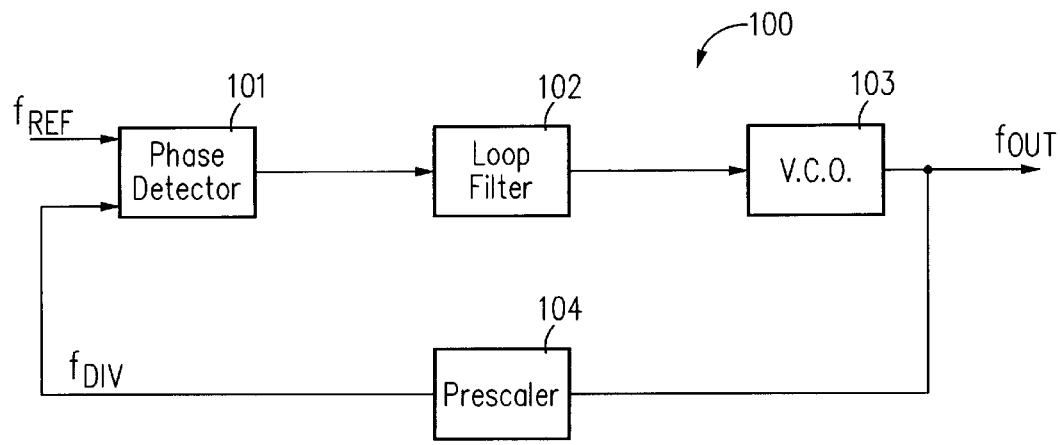
FIG. 1 is a block diagram of a prior art phase-locked-loop(PLL) based frequency synthesizer.
Figure 2:
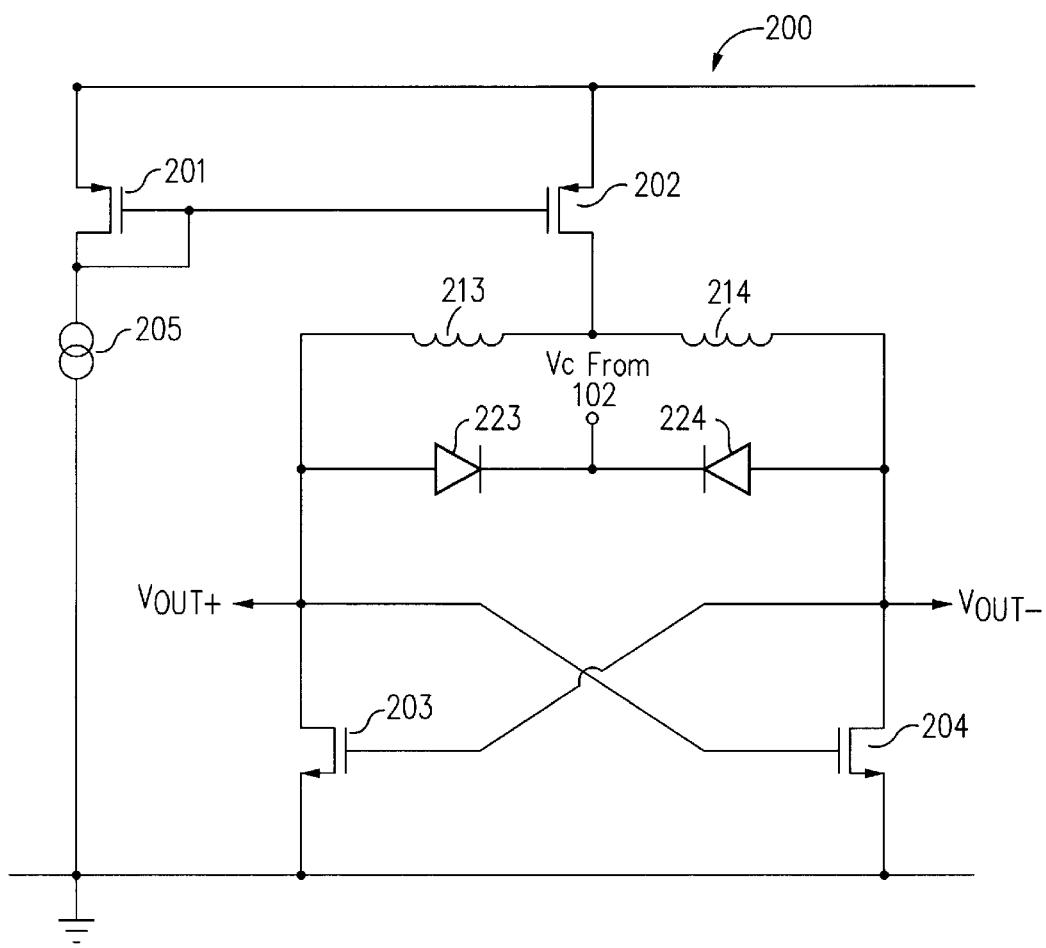
FIG. 2 is a schematic diagram of a prior art CMOS oscillator that utilized two spiral inductors.
Figure 3:
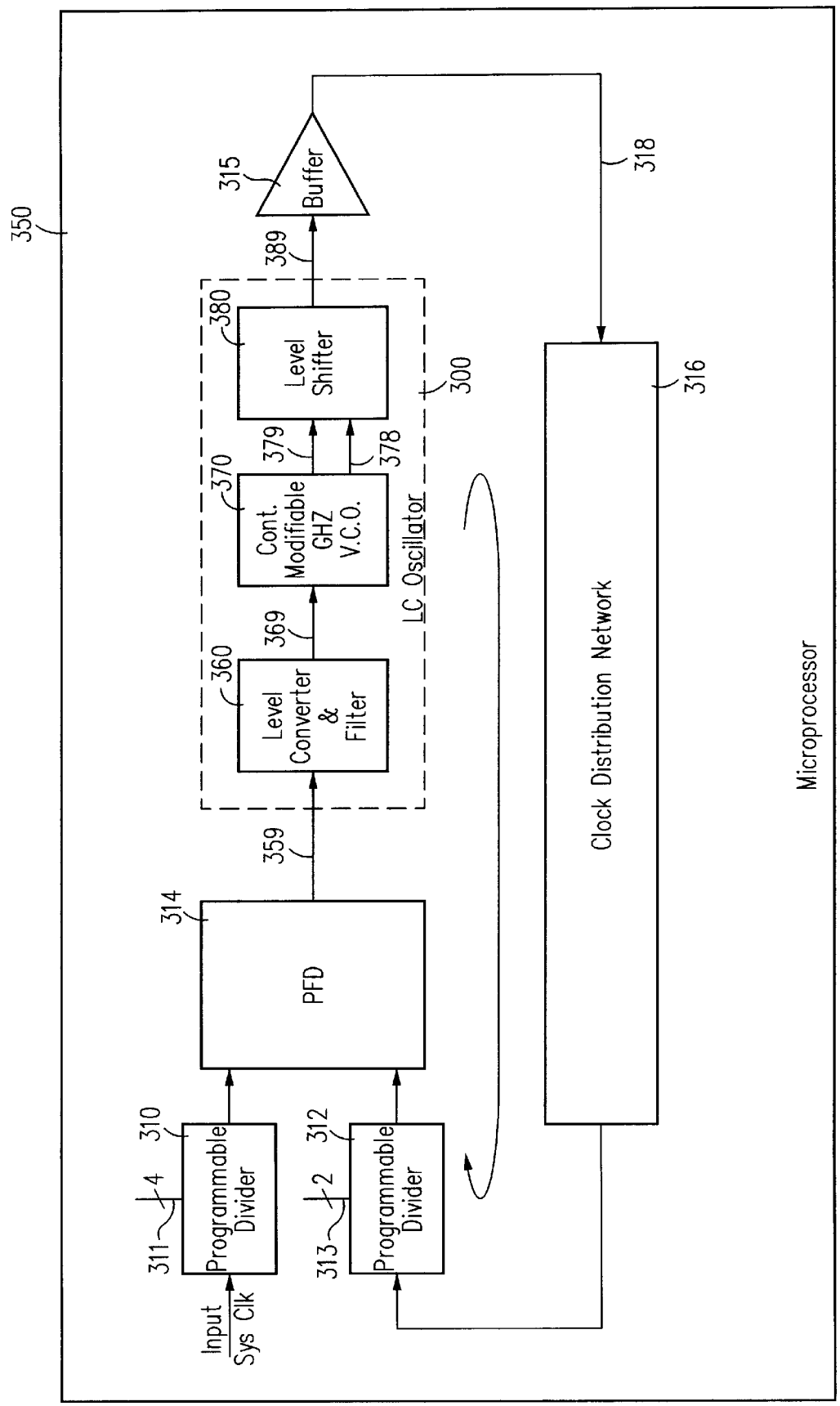
FIG. 3 is a block diagram of a microprocessor that includes an on-chip low phase noise CMOS(complementary metal-oxide-silicon) LC(inductance capacitance)oscillator of this invention.

As illustrated in FIG. 3, LC oscillator 300 of this invention is included in a microprocessor 350. In FIG. 3, only the components associated with LC oscillator 350 in generating an on-chip clock signal are illustrated so as not to detract from the invention. Those of skill in the art will appreciate that microprocessor 350 includes a number of other components, that are not illustrated, which utilize the clock signal generated by LC oscillator 300.

LC oscillator 300 generates a clock signal with a frequency that is determined by a product of an inductance and a capacitance within LC oscillator on oscillator output line 389 to output driver 315. Output driver 315 drives the clock signal on line 318 to a clock distribution network 316.

One of the signals from clock distribution network 316 is fedback to a first programmable divider 312. In one embodiment, programmable divider 312 divides the frequency of the fedback clock signal by one of a plurality of integers, e.g., 10 and 20. The configuration of programmable divider 312 is determined by the signal on control lines 313. The output signal from programmable divider 312 drives a first input line of phase-frequency detector 314.

A system clock signal, typically from an external crystal oscillator, is provided to a first programmable divider 310. Programmable divider 310 is configured to divide the input system clock signal by an integer that is determined from the signals on control lines 311. The output signal from programmable divider 310 drives a second input line of phase-frequency detector 314.

Phase-frequency detectors are known to those of skill in the art and so the particular embodiment of phase-frequency detector 314 is not an essential element of this invention. As explained more completely below, the important aspect is the type of output signal, i.e., voltage or current, and the range of the output signal. One phase-frequency detector suitable for use in this invention is illustrated in FIG. 6 of R. Bhagwan and A. Rogers, "A 1 GHz Dual-Loop Microprocessor PLL with Instant Frequency Shifting," 1997 *IEEE International Solid-State Circuits Conference*, pp. 336, 337 (1997).

The output signal from phase-frequency detector 314 is a frequency control signal on frequency control input line 359 of a level converter and filter circuit 360 of LC oscillator 300. If the frequency control signal is a voltage, level converter and filter circuit 360 converts the voltage to a current and filters the current to minimize high frequency noise on the output signal of circuit 360. Conversely, if the frequency control signal is a current, no level conversion is necessary and so circuit 360 filters the input current to minimize the high frequency noise on the output signal.

In this embodiment, the filter utilized in circuit 360 is a low-pass filter. The pole introduced by the low-pass filter is a part of the total PLL filter.

The output signal from level converter and filter circuit 360 is a filtered frequency control signal on control voltage input line 369 to continuously modifiable gigahertz frequency voltage controlled oscillator circuit 370. Thus, level converter and filter circuit 360 is an interface between phase frequency detection circuit 314 and circuit 370.

Continuously modifiable gigahertz frequency voltage controlled oscillator circuit 370 generates an output signal with a frequency that is dependent on the voltage on control voltage input line 369. In one embodiment, when the voltage on frequency control line 359 is a maximum, a control voltage VC on control voltage input line 369 is a minimum, and the output signal of circuit 370 has the lowest frequency.

In one embodiment, as the voltage on frequency control line 359 decreases, control voltage VC on control voltage input line 369 increases and consequently the output frequency increases. The frequency of the output signal of circuit 370 is a continuous monotonically increasing function of the voltage on control voltage input line 369. When the voltage on frequency control line 359 reaches a maximum, control voltage VC on control voltage input line 369 is a minimum, and the output signal has the highest frequency. Hence, in one embodiment, the voltage on line 369 is changed slowly, and consequently, circuit 370 generates a monotonically increasing or decreasing frequency output signal depending on the direction of the slow change of the frequency control voltage.

In one embodiment, the output signal from continuously modifiable gigahertz frequency voltage controlled oscillator 370 is a differential current signal on lines 378 and 379 to level shifter output circuit 380. Level shifter output circuit 380 converts the two output currents from circuit 370 to a single-ended voltage on line 389 to output driver 315. Output driver 315 provides the output signal to clock distribution network 316, as described above.

Figure 4B:
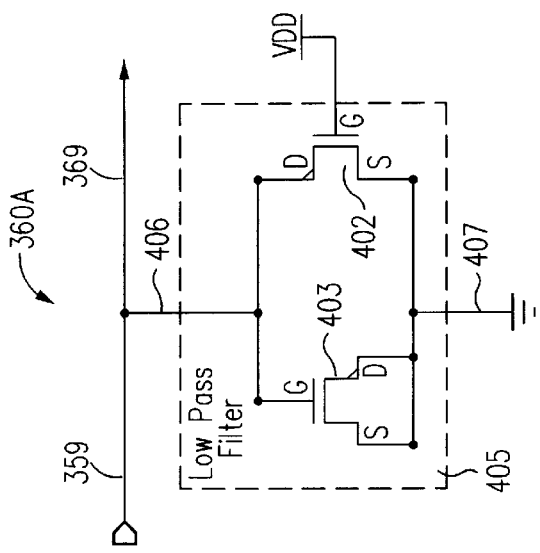
FIG. 4B is a schematic diagram of one embodiment of a filter circuit of this invention that is used for an input current signal on a frequency control input line.
Figure 4C:
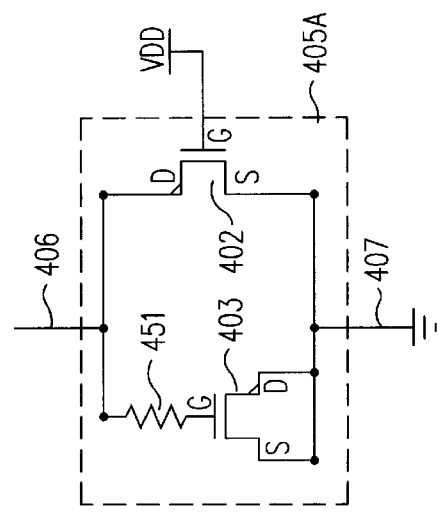
FIG. 4C is a schematic diagram of another embodiment of a filter that can be used in FIGS. 4A and 4B.
Figure 4A:
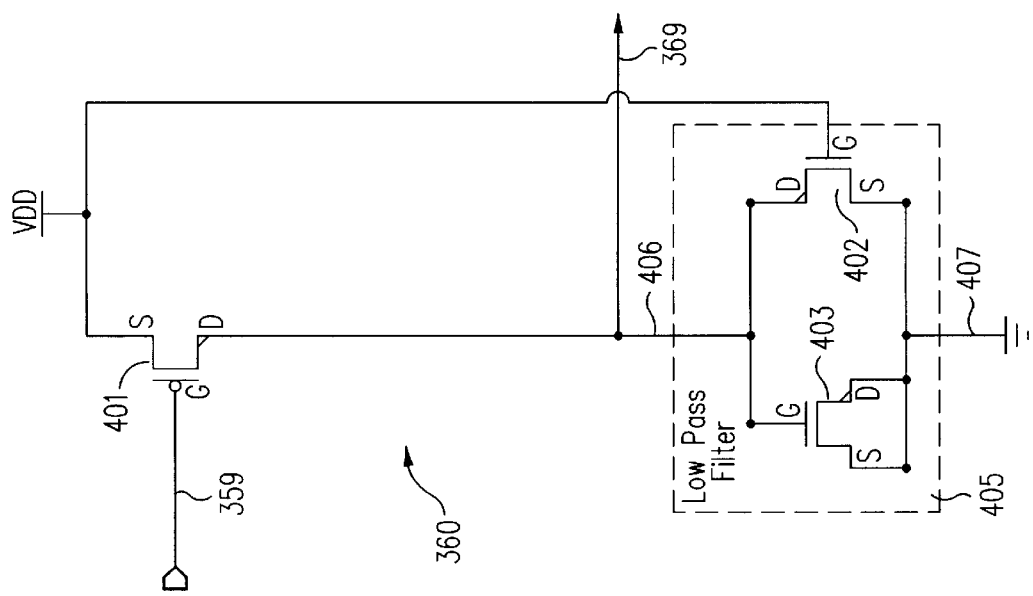
FIG. 4A is a schematic diagram of one embodiment of a level converter and filter circuit of this invention that is used for an input voltage signal on a frequency control input line.

FIG. 4A is a schematic diagram of one embodiment of level converter and filter circuit 360 that is used for an input voltage signal on frequency control input line 359. The signal on input line 359 is applied to a gate G of a P-channel MOSFET 401 that has a source connected to drain power supply voltage VDD. A drain of P-channel MOSFET 401 is connected to a first line 406 of low pass filter 405 and to control voltage line 369.

P-channel MOSFET 401 is used as a transconductor to inject a current onto control voltage line 369. The injected current is dependent on the voltage on frequency control input line 359. When the voltage on frequency control input line 359 is approximately drain power supply voltage VDD, the injected current is approximately zero. When the voltage on frequency control input line 359 is approximately zero, the injected current is a maximum.

The voltage on control voltage line 369 is preferably independent of the output AC current flowing between level converter and filter circuit 360 and continuously modifiable gigahertz frequency voltage controlled oscillator circuit 370.

This independence is achieved through low pass filter 405 having a time constant in the range of from about one nanosecond to about ten nanoseconds for operations of circuit 370 in the gigahertz frequency range. The output AC current, with a frequency in the gigahertz frequency range, can have a peak-to-peak amplitude as large as four milliamps when the voltage on control voltage line 369 is approximately zero.

In this embodiment, low pass filter 405 has a capacitive element 403 and a resistive element 402 connected in parallel between first line 406 of filter 405 and a second line 407 of filter 405. Second line 407 is connected to ground. Capacitive element 403 is implemented with a N-channel MOSFET that has a gate connected to first line 406, and a source and a drain connected to second line 407. Resistive element 404 is also implemented with a N-channel MOSFET that has a gate connected to drain power supply voltage VDD, a drain connected to first line 406, and a source connected to second line 407. N-channel MOSFET 402 operates in the linear range so that it functions as a resistive load.

One key to maintaining the voltage on control voltage line 369 independent from the output AC current on the line is in sizing the channel and consequently the gate area of N-channel MOSFET 403 to obtain the desired time constant and consequently output impedance. The gate area is selected to obtain a capacitance such that the output impedance of circuit 360, in the gigahertz frequency range, is small enough that the voltage variations caused by the output AC current are also small, e.g., less than one millivolt when the output voltage is in the range of zero to 300 millivolts.

In one embodiment, circuit 360 is implemented in 0.6 $\mu$m CMOS and the channel width of P-channel MOSFET 401 is 260 $\mu$m. N-channel MOSFET 402 has a width of 80 $\mu$m, while N-channel MOSFET 403 has a length of 12 $\mu$m and a width of 2600 $\mu$m. The particular sizes of components herein are illustrative only of one embodiment of the invention, and are not intended to limit the invention to the specific sizes given. In view of this disclosure, those of skill in the art can implement the invention in a variety of ways.

In another embodiment of level converter and filter circuit 360A, the output signal from phase-frequency detector 314 is supplied by a charge pump. In this case a constant bias voltage, typically, drain power supply voltage VDD divided by two, is applied to line 359(FIG. 4B) and the current on line 359 is applied directly to control voltage line 369. Thus, in the embodiment of FIG. 4B, P-channel MOSFET 401 is not used to generate a current, but the elements in low pass filter 405 are the same in FIGS. 4A and 4B.

In the embodiment described above, low pass filter 405 is single pole filter. However, in other embodiments of this invention, additional higher frequency poles and zeros can be combined with the single pole. For example, low pass filter 405A (FIG. 4C) includes a zero in combination with the single pole. Specifically, a resistor is connected between line 406 and the gate of N-channel MOSFET 403.

Figure 5:
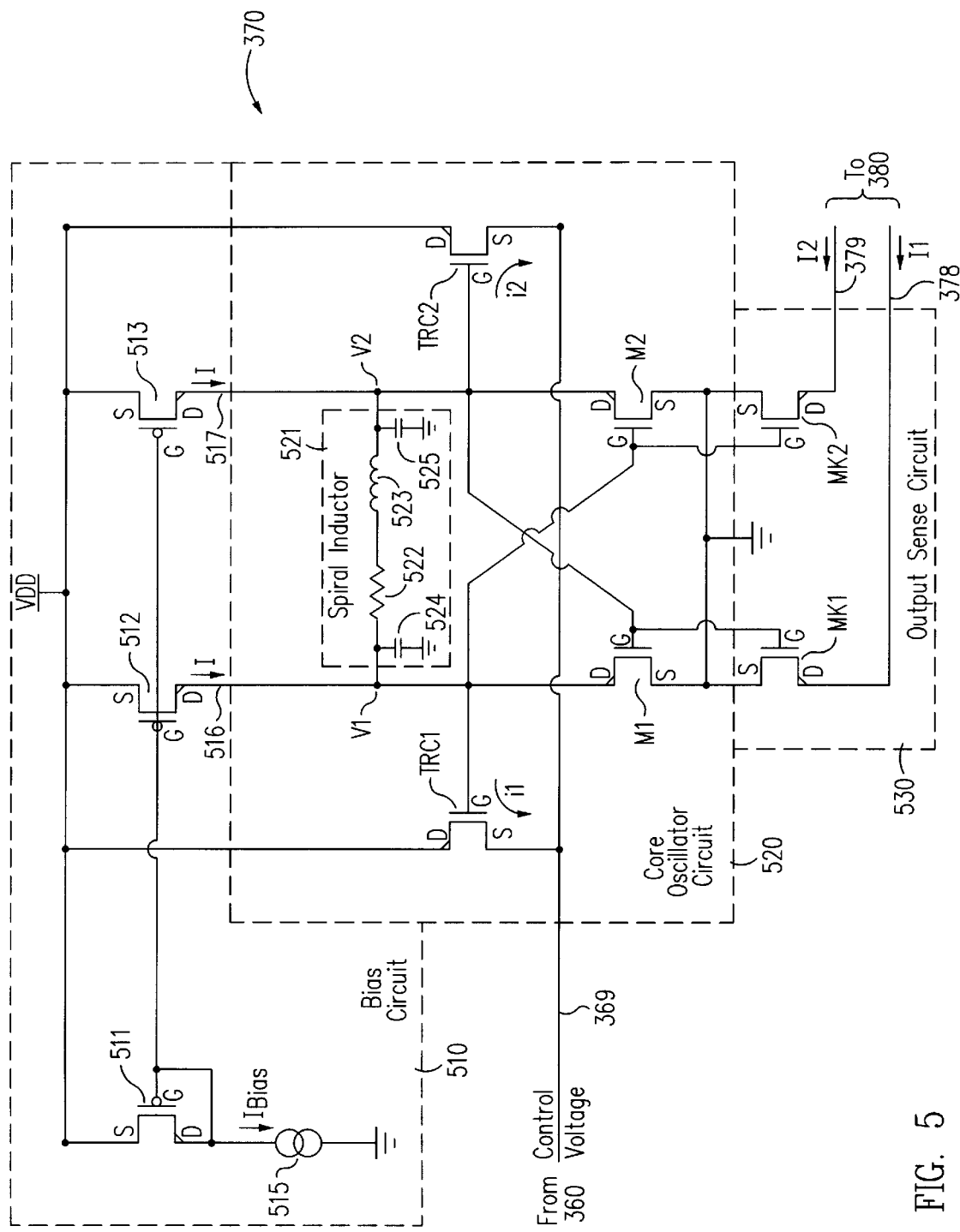
FIG. 5 is a schematic diagram of one embodiment of the continuously modifiable gigahertz frequency voltage controlled oscillator of this invention.

FIG. 5 is a more detailed schematic of one embodiment of continuously modifiable gigahertz frequency voltage controlled oscillator circuit 370. In this embodiment, circuit 370 includes: (a) a bias circuit 510, that includes an ideal current source and a current mirror with one input branch connected to the ideal current source and two output branches; (b) a core oscillator circuit 520, that includes (i) a spiral inductor and two voltage controlled capacitors, which together form an LC resonant circuit with two voltage nodes V1 and V2 that are connected to the two output branches of the current mirror, and (ii) two transistors that function as negative resistors to provide power to the LC resonant circuit; and (c) an output sense circuit 530 that includes two transistors that sense the oscillating voltages on voltage nodes V1 and V2 in core oscillator 520 and provide output currents dependent upon the sensed voltages on a plurality of sense current output lines.

Ideal current source 515 in bias circuit 510 generates a constant current IBIAS, which in one embodiment is 5 $\mu$amps. P-channel MOSFET 511, in the input branch of the current mirror, is connected between ideal current source 515 and drain power supply voltage VDD, that is a first reference voltage. Specifically, a source of P-channel MOSFET 511 is connected to drain power supply voltage VDD and a drain and a gate of P-channel MOSFET 511 are connected to ideal current source 515 so that P-channel MOSFET 511 functions as a reference diode.

In one embodiment, ideal current source is a N-channel MOSFET with a gate connected to drain power supply voltage VDD, a drain connected to the drain and gate of P-channel MOSFET 511, and a source connected to ground, i.e., a second reference voltage. Ideal current source 515 is also connected to a first bias transistor 512 and to a second bias transistor 513 to form the two output branches of the current mirror.

Specifically, ideal current source 515 is connected to a gate of P-channel MOSFET 512, and to a gate of P-channel MOSFET 513. A source of P-channel MOSFET 512 is connected to drain power supply voltage VDD while a drain of P-channel MOSFET 512 is connected to a first bias circuit output line 516 that in turn is connected to voltage node V1 of core oscillator circuit 520. A source of P-channel MOSFET 513 is connected to drain power supply voltage VDD while a drain of P-channel MOSFET 513 is connected a second bias circuit output line 517 that in turn is connected to voltage node V2 of core oscillator circuit 520.

The channel width of MOSFET 511 and channel widths of MOSFETs 512 and 513 are selected so that constant current I is about twenty times current IBIAS in one embodiment. For 0.6 $\mu$m CMOS, the channel width of MOSFET 511 is 7.2 $\mu$m, and channel width of MOSFETs 512 and 513 is 136 $\mu$m. Here, the channel width is used to specify the size of the MOSFET. The important aspect is to minimize the power in the input branch of the current mirror and to provide a constant current I to both voltage nodes V1 and V2. Hence, in this embodiment, bias circuit 510 includes bias MOSFETs 512 and 513 that inject a current I into nodes V1 and V2, respectively.

A first element in core oscillator circuit 520 is a spiral inductor 521 connected between voltage nodes V1 and V2 of core oscillator circuit 520, i.e., a first lead of spiral inductor 521 is connected to node V1 and a second lead of spiral inductor is connected to node V2. Spiral inductor 521 has a first order representation of an inductance 523, a parasitic resistance 522 and parasitic capacitances 524 and 525. Parasitic resistance 522 includes metal skin effects and substrate losses. Parasitic capacitances 524 and 525 of spiral inductor 521 are typically smaller than the other capacitances in circuit 370. Inductance 523 is in the range of 0.1 nanohenry(nh) to 100 nh, and in one embodiment, 2 nh to 10 nh. For this example, an inductance of 5 nh was used. The particular inductance selected depends for example, upon the feature size used to implement the inductor, the feature size used to implement the other active elements, the silicon area available, and the frequency range of interest.

N-channel MOSFET M1, in core oscillator circuit 520, has a drain connected to node V1, a source connected to ground, and a gate connected to node V2. N-channel MOSFET M2, in core oscillator circuit 520, has a drain connected to node V2, a source connected to ground, and a gate connected to node V1. Hence, core oscillator circuit 520 includes MOSFETs M1 and M2 cross-coupled between nodes V1 and V2. MOSFETs M1 and M2 function as negative resistances and provide power to circuit 370.

The final two elements in core oscillator circuit 520 are voltage controlled capacitors that are implemented using MOSFETs TRC1 and TRC2. N-channel MOSFET TRC1 has a drain connected to drain power supply voltage VDD, a source connected to control voltage line 369 and a gate connected to node V1. N-channel MOSFET TRC2 has a drain connected to drain power supply voltage VDD, a source connected to control voltage line 369 and a gate connected to node V2.

Output sense circuit 530 includes two sense transistors, N-channel MOSFETs MK1 and MK2. A drain of MOSFET MK1 is connected to output line 378, a source is connected to ground, and a gate is connected to node V2. A drain of MOSFET MK2 is connected to output line 379, a source is connected to ground, and a gate connected is to node V1. MOSFETs MK1 and MK2 sense the voltages at nodes V2 and V1, respectively, and draw a current from level shifter 380 on lines 378 and 379, respectively.

Core oscillator circuit 520 does not have any stable DC operating point. Specifically, the only valid DC operating point, in which voltages V1 and V2 must be exactly identical, is not stable. At start-up, electrical noise of the MOSFETS and/or small mismatches between the two sides of circuit 520 result in a small difference in DC voltage between nodes V1 and V2. The peak-to-peak voltage difference between nodes V1 and V2 grows with time, as explained more completely below, which in turn causes a current to flow through spiral inductor 521. A resonate loop formed by spiral inductor 521, voltage controlled capacitors TRC1 and TRC2, and the parasitic capacitances in core oscillator circuit 520 result in oscillating voltages at nodes V1 and V2.

In parallel with the capacitance of voltage controlled capacitor TRC1 is a capacitance C1parasitic, which is, in this embodiment:

C1parasitic≅C(Induct524)+C(GD512)+C(DB512)

C(GSM2)+C(GSMK2)

where:
C(Induct524) is a parasitic capacitance of spiral inductor 521.
C(GD512) is the gate-to-drain capacitance of MOSFET 512;
C(DB512) is the drain-to-bulk capacitance of MOSFET 512;
C(GSM2) is the gate-to-source capacitance of MOSFET M2; and
C(GSMK2) is the gate-to-source capacitance of MOSFET MK2.

In parallel with the capacitance of voltage controlled capacitor TRC2 is a capacitance C1parasitic, which is, in this embodiment:

C2parasitic≅C(Induct525)+C(GD513)+C(DB513)

C(GSM1)+C(GSMK1)

where:

C(Induct525) is another parasitic capacitance of spiral inductor 521.
C(GD513) is the gate-to-drain capacitance of MOSFET 513;
C(DB513) is the drain-to-bulk capacitance of MOSFET 513;
C(GSM1) is the gate-to-source capacitance of MOSFET M2; and
C(GSMK1) is the gate-to-source capacitance of MOSFET MK2.

Parasitic capacitances C1parasitic and C2parasitic are each about one picofarad for 0.6 $\mu$m CMOS.

The amplitude of the voltage oscillations is limited by the nonlinear nature of the resistance of MOSFETs MI and M2. The resistance is negative for small amplitude voltage oscillations. (The resistance has a negative current-voltage characteristic for small voltages.) For small voltage differences between nodes V1 and V2, the negative resistance of MOSFETs M1 and M2 provide power to circuit 370 that more than compensates for the losses associated with power dissipated in the equivalent series resistance 522 of spiral inductor 521; the series resistances of capacitors TRC1 and TRC2; and the series resistance of current sources in bias circuit 510.

The circuitry is designed to minimize the parasitic effects of the wires interconnecting the components in the circuit. The width of the wires is much wider than the minimum feature size. For example, in one embodiment, for 0.6 $\mu$m CMOS, the wires have a width of 10 $\mu$m. In addition, the wires are constructed using multiple parallel metal layers, for example three metal layers. To further minimize the parasitic resistance of the wires, many contacts are made between each of the parallel metal layers, for example, 100 contacts were made.

The extra power provided by MOSFETs M1 and M2 for small voltages results in larger and larger voltage oscillations at nodes V1 and V2. The slope of the current-voltage characteristic of the resistance of MOSFETs M1 and M2 is not constant, and becomes less negative as the voltage amplitude increases.

Hence, as the voltage amplitude increases, the power provided by the negative resistance of MOSFETs M1 and M2 increases less than the increase of power dissipation in the approximately linear resistance of the equivalent series resistance 522 of spiral inductor 521; the series resistances of capacitors TRC1 and TRC2; and the series resistance of current sources in bias circuit 510. A limit cycle of periodic oscillations is achieved for a voltage amplitude for which the average power provided by the negative resistance of MOSFETs M1 and M2 equals the power losses associated with the equivalent series resistance 522 of spiral inductor 521; the series resistances of capacitors TRC1 and TRC2; and the series resistance of current sources in bias circuit 510.

In the above discussion, the capacitance of MOSFETs TRC1 and TRC2 was assumed fixed. However, the capacitance of MOSFETs TRC1 and TRC2 can be continuously varied by changing the voltage across MOSFETs TRC1 and TRC2. This is accomplished by changing the voltage on control voltage line 369 from level converter and filter circuit 360.

FIGS. 6A and 6B are each a cross-sectional view of a MOSFET TRCi, where i is 1, 2, with voltage Vi on gate G, where voltage Vi is the voltage on node V1 when i is 1, and is the voltage on node V2 when i is 2. Voltage VDD is applied to drain D, and control voltage VC on control voltage line 369 is applied to source S.

In FIG. 6A, voltage VC is larger than voltage Vi minus threshold voltage Vth of MOSFET TRCi, and so there is no conducting inversion layer under gate G. Hence, in this configuration, MOSFET TRCi is effectively turned-off, and the capacitance from gate-to-source is minimized.

In FIG. 6B, voltage VC is less than voltage Vi minus threshold voltage Vth of MOSFET TRCi, and so there is a conducting inversion layer 602 under gate G. Therefore, the gate-to-source capacitance of MOSFET TRCI in FIG. 6B is greater than the gate-to-source capacitance of MOSFET TRCi in FIG. 6A. As the capacitance of MOSFETs TRC1 and TRC2 is changed by the voltage on control voltage line 369, the product of the inductance and capacitance of core oscillator circuit 520 changes which in turn changes the oscillation frequency of circuit 520. The size of MOSFETs TRC1 and TRC2 is selected so as to provide adequate control of the voltage oscillations for a particular application in a microprocessor.

Hence, the only input signal to circuit 370 is control voltage VC, which is connected to the sources of MOSFETs TRC1 and TRC2. As the gate voltages of MOSFETs TRC1 and TRC2 oscillate at high frequency, there is an effective capacitance between the gate and source of each MOSFET, and high frequency AC currents i1 and i2, respectively. High frequency AC currents i1 and i2 are about 180 degrees out of phase, which helps in canceling the net AC current flow on control voltage line 369 to level converter and filter circuit 360.

FIG. 7 is a computer simulation of the oscillatory behavior of one embodiment of circuit 360 and circuit 370. In this embodiment, the components in level converter and filter 360 and bias circuit 510 have the sizes described above. Core oscillator circuit 520 and output sense circuit 530 also are implemented in 0.6 μm CMOS. The channel width of N-channel MOSFETs M1 and M2 is 156.8 μm. The channel width of N-channel MOSFETs MK1 and MK2 is 56.8 μm. N-channel MOSFETs TRC1 and TRC2 have a length of 12 μm and a width of 160 μm. As pointed out above, the particular sizes of components herein are illustrative only of one embodiment of the invention, and are not intended to limit the invention to the specific sizes given.

In FIG. 7, drain power supply voltage VDD is 1.30 volts. Initially, the input signal level on frequency control input line 359 is zero volts. The output signal level VC on control voltage line 369 from level converter and filter circuit 360 in response to the zero volt input signal is about 250 millivolts. The stable oscillation frequency of circuit 300 is about 1.72 GHz.

At time 240, the input signal level on frequency control input line 359 goes from 0.0 to 1.2 volts. The output signal level VC on control voltage line 369 from level converter and filter circuit 360, in response to the 1.2 volt input signal decays to zero volts with a time constant that is characteristic of low pass filter 405. The stable oscillation frequency of circuit 300 for a zero control voltage is about 1.35 GHz, which is about a 22% change((1.72–1.35)/1.72).

Figure 8:
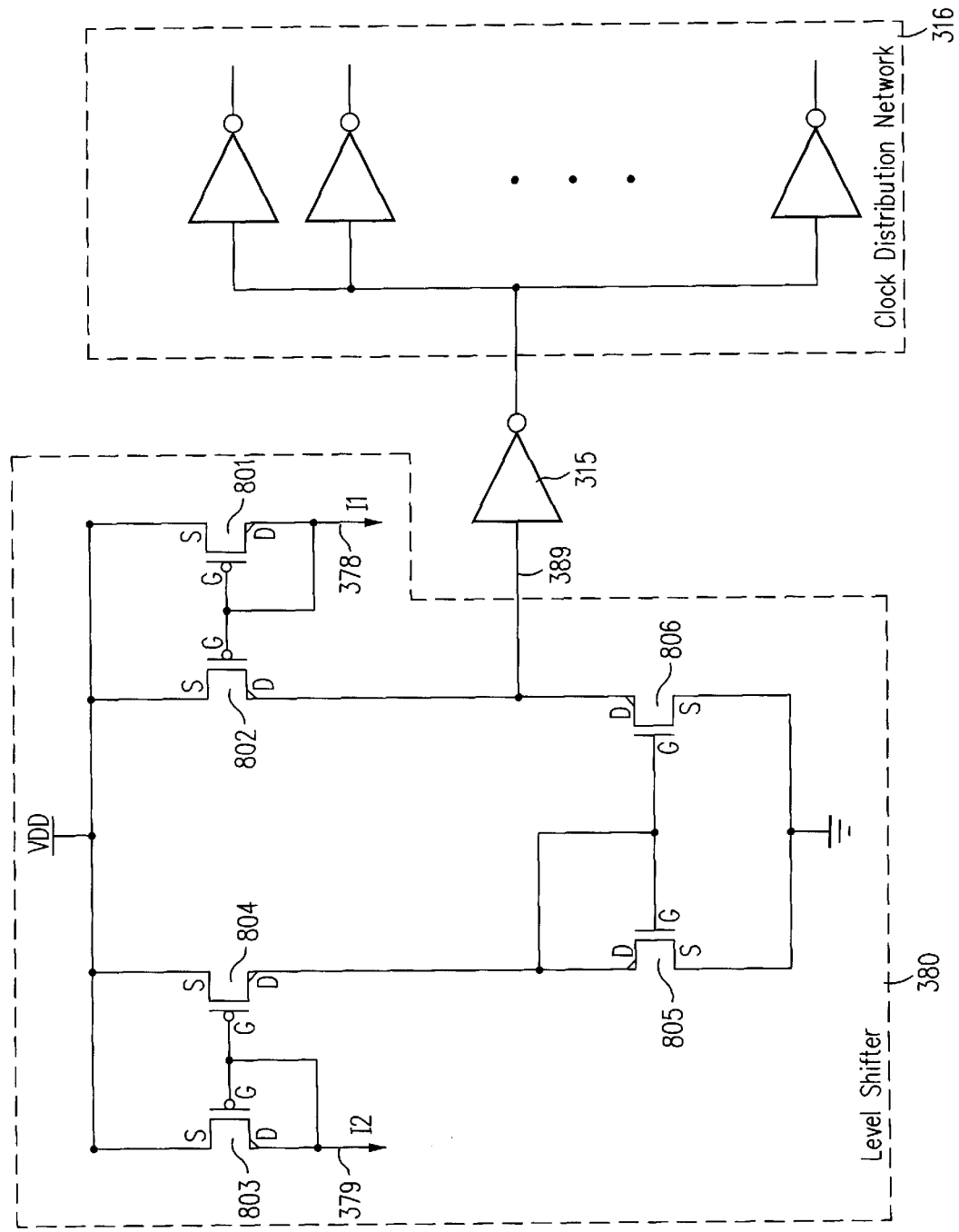
FIG. 8 is a schematic diagram of one embodiment of the level shifter of this invention.

The AC currents on lines 378 and 379 are drawn from level shifter output circuit 380. As described above, level shifter output circuit 380 converts currents I1 and I2 to a single-ended voltage on oscillator output line 389 to output driver 315. FIG. 8 is a schematic of one embodiment of level shifter output circuit 380. Current I1 on line 378 is drawn from to a first current mirror made up of P-channel MOSFETs 801 and 802. Current I2 on line 379 is drawn from a second current mirror made-up of P-chancel MOSFETs 803 and 804.

MOSFET 801 has a drain and a gate connected to line 378, and a source connected to drain power supply voltage VDD. MOSFET 802 has a gate connected to line 378, a source connected to drain power supply voltage VDD, and a drain connected to oscillator output line 389.

MOSFET 803 has a drain and a gate connected to line 379, and a source connected to drain power supply voltage VDD. MOSFET 804 has a gate connected to line 379, a source connected to drain power supply voltage VDD, and a drain connected to a third current mirror made-up of N-channel MOSFETs 805 and 806.

MOSFET 805 has a drain and a gate connected to the drain of MOSFET 804, and a source connected to ground. MOSFET 806 has a gate connected to the drain of MOSFET 804, a source connected to ground and a drain connected to oscillator output line 389 that in turn is connected to output driver 315.

In this embodiment, level shifter circuit 380, buffer 315 and clock distribution network 316 are implemented using 0.25 μm CMOS. The width of the P-channel MOSFETs is 72 μm, and the width of the N-channel MOSFETs is 56.8 μm. In the inverters, the P-channel MOSFETs have a width of 24 μm, while the N-channel MOSFETs have a width of 12 μm. In another embodiment, all of LC oscillator 300 is implemented in 0.25 μm CMOS. Again, the particular dimensional characteristics described herein are illustrative only and are not intended to limit the invention to the specific feature sizes described.

In this embodiment of LC oscillator 300 not only is the oscillator insensitive to fluctuations in drain power supply voltage VDD, but also LC oscillator 300 is suitable for use with low drain power supply voltages. Unlike some prior art circuits that required a three to five volt power supply voltage, LC oscillator 300 of this invention requires only a power supply voltage that is greater than the threshold voltage Vth of the CMOS transistors used in the circuit.

The embodiments of LC oscillator 300 described herein are only illustrative and are not intended to limit the invention to the specific embodiments disclosed. In view of the above disclosure, those of skill in the art can implement the invention in a wide variety of applications that require a gigahertz oscillator capable of being varied over a wide frequency range.

We claim:

1. An oscillator circuit comprising:
    a bias circuit having a first bias circuit output line and a second bias circuit output line;
    a CMOS core oscillator circuit having:
        a spiral inductor connected between the first and second bias circuit output lines;
        a first voltage controlled capacitor having a first lead connected to the first bias circuit output line; and
        a second voltage controlled capacitor having a first lead connected to the second bias circuit output line; and
    an output sense circuit having:
        a first sense circuit input line connected to the second bias circuit output line;
        a second sense circuit input line connected to the first bias circuit output line;
        a first sense circuit output line; and
        a second sense circuit output line.

2. The oscillator circuit of claim 1 further comprising:
    a filter circuit having a control voltage output line connected to a second lead of the first voltage controlled capacitor, and to a second lead of the second voltage controlled capacitor.

3. The oscillator circuit of claim 2 wherein the filter circuit includes a low pass filter.

4. The oscillator circuit of claim 1 further comprising:
    a level shifter output circuit connected to the first and second sense circuit output lines, and having an oscillator output line wherein the level shift circuit generates a high frequency oscillating voltage signal on the oscillator output line in response to oscillating currents on the first and second sense circuit output lines.

5. The oscillator circuit of claim 1 wherein the core oscillator circuit further comprises:
a first MOSFET having a first lead connected to the first bias circuit output line, a second lead connected to a first reference voltage, and a gate connected to the second bias circuit output line; and
a second MOSFET having a first lead connected to the second bias circuit output line, a second lead connected to the first reference voltage, and a gate connected to the first bias circuit output line.

6. The oscillator circuit of claim 5 wherein the first voltage controlled capacitor further comprises:
a third MOSFET having a gate connected to the first lead of the first voltage controlled capacitor, a first lead connected to a second reference voltage, and a second lead connected to a control voltage line.

7. The oscillator circuit of claim 6 wherein the second voltage controlled CMOS capacitor further comprises:
a fourth MOSFET having a gate connected to the first lead of the second voltage controlled CMOS capacitor, a first lead connected to the second reference voltage, and a second lead connected to the control voltage line.

8. The oscillator circuit of claim 1 wherein the first voltage controlled CMOS capacitor further comprises:
a first MOSFET having a gate connected to the first lead of the first voltage controlled CMOS capacitor, a first lead connected to a reference voltage, and a second lead connected to a control voltage line.

9. The oscillator circuit of claim 8 wherein the second voltage controlled CMOS capacitor further comprises:
a second MOSFET having a gate connected to the first lead of the second voltage controlled CMOS capacitor, a first lead connected to the reference voltage, and a second lead connected to the control voltage line.

10. The oscillator circuit of claim 1 wherein the oscillator circuit is on-chip within a microprocessor.

11. The oscillator circuit of claim 4 wherein the oscillator circuit is on-chip within a microprocessor.

12. The oscillator circuit of claim 11 wherein the microprocessor includes a clock distribution network coupled to the oscillator output line.

13. An oscillator circuit comprising:
a bias circuit having a first bias circuit output line and a second bias circuit output line;
a CMOS core oscillator circuit having:
a spiral inductor connected between the first and second bias circuit output lines;
a first voltage controlled capacitor having a first lead connected to the first bias circuit output line; and
a second voltage controlled capacitor having a first lead connected to the second bias circuit output line; and
a level shift and filter circuit having a control voltage output line connected to a second lead of the first voltage controlled capacitor, and to a second lead of the second voltage controlled capacitor.

14. The oscillator circuit of claim 13 wherein the level shift and filter circuit includes a low pass filter.

15. An oscillator circuit comprising:
a bias circuit having a first bias circuit output line and a second bias circuit output line wherein the bias circuit further comprises a current mirror having an input branch and two output branches where the first bias circuit output line is connected to one of the two output branches, and the second bias circuit output line is connected to another of the two output branches; and
a CMOS core oscillator circuit having:
a spiral inductor connected between the first and second bias circuit output lines;
a first voltage controlled capacitor having a first lead connected to the first bias circuit output line; and
a second voltage controlled capacitor having a first lead connected to the second bias circuit output line.

16. The oscillator circuit of claim 15 wherein the bias circuit further comprises a current source connected to the input branch of the current mirror.

17. The oscillator circuit of claim 15 wherein the input branch of the current mirror includes a first MOSFET having a first channel of a first size, and one of the two output branches has a second MOSFET having a second channel of a second size wherein the second size is greater than the first size.

18. A LC oscillator circuit comprising:
a level shifter and filter circuit having a frequency control input line and a control voltage output line;
a continuously modifiable gigahertz frequency voltage controlled oscillator connected to the control voltage output line, and having a plurality of output lines wherein an oscillation frequency of a signal on each of the plurality of output lines is determined by a level of a signal on the control voltage output line and wherein the continuously modifiable gigahertz frequency voltage controlled oscillator further comprises:
a bias circuit having a first bias circuit output line and a second bias circuit output line; and
a CMOS core oscillator circuit having:
a spiral inductor connected between the first and second bias circuit output lines;
a first voltage controlled capacitor having a first lead connected to the first bias circuit output line; and
a second voltage controlled capacitor having a first lead connected to the second bias circuit output line; and
a level shifter output circuit connected to the plurality of output lines of the continuously modifiable gigahertz frequency voltage controlled oscillator, and having an oscillator output line wherein the level shifter output circuit generates an oscillating signal on the oscillator output line in response to signals on the plurality of output lines of the continuously modifiable gigahertz frequency voltage controlled oscillator.

19. The LC oscillator circuit of claim 18 wherein the continuously modifiable gigahertz frequency voltage controlled oscillator further comprises:
an output sense circuit having:
a first sense circuit input line connected to the second bias circuit output line;
a second sense circuit output line connected to the first bias circuit output line;
a first sense circuit output line; and
a second sense circuit output line wherein the first and second sense circuit output lines are the plurality of output lines.

20. The LC oscillator circuit of claim 18 wherein the oscillator circuit is on-chip within a microprocessor.

21. The LC oscillator circuit of claim 20 wherein the microprocessor includes a clock distribution network coupled to the oscillator output line.

22. A CMOS core oscillator circuit comprising:
   a spiral inductor connected between first and second constant current bias voltage lines;
   a first voltage controlled capacitor having a first lead connected to the first constant current bias voltage line; and
   a second voltage controlled capacitor having a first lead connected to the second constant current bias voltage line.

23. The CMOS core oscillator circuit of claim 22 further comprising:
   a first MOSFET having a first lead connected to the first constant current bias voltage line, a second lead connected to a first reference voltage, and a gate connected to the second constant current bias voltage line; and
   a second MOSFET having a first lead connected to the second constant current bias voltage line, a second lead connected to the first reference voltage, and a gate connected to the first constant current bias voltage line.

24. The CMOS core oscillator circuit of claim 23 wherein the first voltage controlled capacitor further comprises:
   a third MOSFET having a gate connected to the first lead of the first voltage controlled capacitor, a first lead connected to a second reference voltage, and a second lead connected to a control voltage line.

25. The CMOS core oscillator circuit of claim 24 wherein the second voltage controlled capacitor further comprises:
   a fourth MOSFET having a gate connected to the first lead of the second voltage controlled capacitor, a first lead connected to the second reference voltage, and a second lead connected to the control voltage line.

26. The CMOS core oscillator circuit of claim 22 wherein the first voltage controlled capacitor further comprises:
   a first MOSFET having a gate connected to the first lead of the first voltage controlled capacitor, a first lead connected to a reference voltage, and a second lead connected to a control voltage line.

27. The CMOS core oscillator circuit of claim 26 wherein the second voltage controlled capacitor further comprises:
   a second MOSFET having a gate connected to the first lead of the second voltage controlled capacitor, a first lead connected to the reference voltage, and a second lead connected to the control voltage line.

28. The CMOS core oscillator circuit of claim 22 wherein the core oscillator circuit is on-chip within a microprocessor.

29. The CMOS core oscillator circuit of claim 28 wherein the microprocessor includes a clock distribution network coupled to the oscillator output line.

* * * * *